US006975688B2

(12) United States Patent
Rexberg et al.

(10) Patent No.: US 6,975,688 B2
(45) Date of Patent: Dec. 13, 2005

(54) OFF-LINE MCPA CALIBRATION

(75) Inventors: Leonard Rexberg, Hässelby (SE); Bernt Johansson, Kista (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 840 days.

(21) Appl. No.: 09/947,054

(22) Filed: Sep. 5, 2001

(65) Prior Publication Data

US 2002/0027961 A1 Mar. 7, 2002

(30) Foreign Application Priority Data

Sep. 7, 2000 (SE) .................................. 0003071

(51) Int. Cl.[7] .............................................. H04L 25/03
(52) U.S. Cl. ........................ 375/297; 455/63; 455/115; 330/151
(58) Field of Search ................................. 375/285, 295, 375/296, 297, 345; 455/50.1, 63, 115, 126, 455/296; 330/27 B, 151, 149

(56) References Cited

U.S. PATENT DOCUMENTS

| 5,262,734 | A |   | 11/1993 | Dent et al. |         |
|-----------|---|---|---------|-------------|---------|
| 5,732,333 | A |   | 3/1998  | Cox et al.  |         |
| 5,937,011 | A | * | 8/1999  | Carney et al. | 375/297 |
| 5,959,499 | A | * | 9/1999  | Khan et al. | 330/149 |
| 6,304,140 | B1 | * | 10/2001 | Thron et al. | 330/149 |

FOREIGN PATENT DOCUMENTS

WO    WO 00/01065 A1    1/2000

* cited by examiner

Primary Examiner—Dac V. Ha

(57) ABSTRACT

A method is disclosed for obtaining high throughput linearity using a pre-distorter in front of a RF power amplifier, for instance a multi-carrier power amplifier (MCPA) for a communications system. The method can be carried out off-line to thereby save costs and components otherwise needed for a common on-line feed back. In a first step calibration is performed by measuring by an off-line spectrum analysis an output spectrum of the power amplifier and simultaneously applying a known input signal. As a next step digitized parameters characterizing the power amplifier are calculated in the frequency domain by comparing spectrum points between input spectrum and output spectrum. Thereafter calculated and weighted digitized parameters are transferred to a pre-distorting device. In a third step the known signal spectrum is transferred to the pre-distorting device feeding its output signal together with the original known signal spectrum to the power amplifier input thereby compensating for power amplifier non-linearity and minimizing inter-modulation products. Finally in a fourth step an uncompensated known input spectrum is compared with a corresponding compensated output spectrum of the power amplifier and the steps of calibration calculation are repeated until a best optimization input signal to the power amplifier regarding the inter-modulation products of the output signal has been achieved.

3 Claims, 5 Drawing Sheets

STATE OF THE ART

STATE OF THE ART

Step 2: Compute best PD

Step 3: Apply PD $G(v) = v + \beta_3 \cdot v^3 + \beta_5 \cdot v^5$

Solve for $\beta$

US 6,975,688 B2

OFF-LINE MCPA CALIBRATION

TECHNICAL FIELD

The present invention relates to signal pre-distortion for operation of power amplifiers, and more specifically to off-line digital signal pre-distortion to achieve high throughput linearity of a RF power amplifier, for instance a multi-carrier power amplifier (MCPA) for a communications system.

BACKGROUND

One of the operator's main goals is to be able to offer high capacity to their customers in the network. High capacity in terms of number of channels in a cellular network requires in turn a tightening of the frequency plan. That is, more frequencies must be made available in a given area than before. The base station has to handle more carriers at the same site. Conventional systems like TDMA (DAMPS) and GSM require more channels and upcoming systems like the WCDMA instead requires a continuous wide bandwidth. This in turn calls for ultra linear amplifiers.

Linear amplifiers are used to amplify several carriers at the same time, as opposite to amplifying each carrier separately and then add them up in, for example, a hybrid-combiner. Hybrid-combiners such as 90° branch line couplers have the disadvantage that for each doublet of carriers there is a 3 dB power loss. So for example, combining 16 carriers means 4×3=12 dB loss. That means only 6% ($=10^{-12/10}$) overall power efficiency and, the figure gets worse the more carriers that are added.

A linear power amplifier typically also has an efficiency of about 6% but it keeps relatively constant efficiency as more carriers are added. Moreover, only one amplifier has to be used for all carriers. The main problem with power amplifiers is the linearity of the AM-AM characteristics, whereas hybrid combiners do not suffer from this. Most cellular systems require inter-modulation (IM) products to be in the order of 70 dB down from the carrier. Extensive work has been done to linearize power amplifiers of which feed-forward seems to be the most promising method. Inter-modulation products are simply subtracted at the output of the amplifier by comparing input and output signals of the main amplifier. An error-amplifier adjusts the level of the inter-modulation frequency products (output minus input).

Feed-forward can improve linearity to a certain degree but then it becomes very difficult to achieve the last few dB's necessary for full compliance. A way of further linearizing the amplifier is to pre-distort the input signal to the amplifier and compensate for the non-linearity. There are a number of ways as how to accomplish this. One way is to pre-distort within the feed-forward loop of the MCPA itself. Usually this is done in an analog RF fashion. RF pre-distortion (PD) may also be done outside the full MCPA.

Another way is to implement digital pre-distortion. Digital PD may be used whenever there is a digital combined signal at hand. The introduction of so called software transceivers makes it particularly convenient to extract this signal. On a system-level there would be a digital software transceiver, a broadband digital-to-analog converter (DAC), some RF components and the RF MCPA basically connected to the antenna port. A digital pre-distorter would preferably be placed between the software transceiver and the DAC.

The general idea of pre-distortion is exemplified in FIGS. 1a and 1b. It shows a non-linear MCPA giving IM-spuriouses when only two CW signals are fed to the input connector. So, if the IM is well below the main carrier levels, it would in theory be possible to cancel the IM at the MCPA output by just adding the same CW carriers at IM frequency at the input. But then with a reversed phase in comparison to the output IM. This is the basic idea of pre-distortion, but other signals than CW makes it necessary to actually produce a correct IM-spectrum to be added at the MCPA input port.

SUMMARY

The present inventive disclosure describes a simple and straightforward way to make the necessary computations and implementations off-line to make pre-distortion work in a handy way.

A method is then disclosed for in a power amplifier obtaining low inter-modulation characteristics. In a first step calibration is performed by measuring an output spectrum of the power amplifier and simultaneously applying a known input signal spectrum by means of an off-line spectrum analysis. As a next step digitized parameters characterizing the power amplifier are calculated in the frequency domain by comparing spectrum points between input spectrum and output spectrum. Thereafter calculated and weighted digitized parameters are transferred to a pre-distorting device. In a third step the known signal spectrum is input to the pre-distorting device feeding its output signal together with the original known signal spectrum to the power amplifier input thereby compensating for power amplifier non-linearity and minimizing inter-modulation products. Finally in a fourth step an uncompensated known input spectrum is compared with a corresponding compensated output spectrum of the power amplifier and repeating the steps of calibration calculation until a best optimization input signal to the power amplifier regarding the inter-modulation products of the output signal has been achieved.

A method according to the present invention is set forth by the independent claim 1 and further embodiments are set forth by the dependent claims 2 to 3.

SHORT DESCRIPTION OF THE DRAWINGS

The invention, together with further objects and advantages thereof, may best be understood by making reference to the following description taken together with the accompanying drawings, in which.

DESCRIPTION

Technical Background

Figure 1:
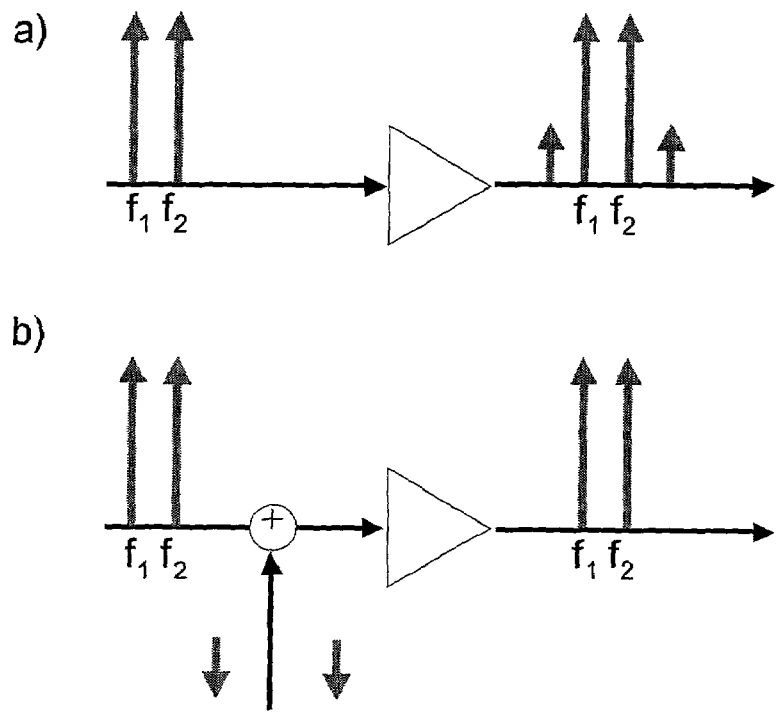
FIG. 1a illustrates a non-linear MCPA giving rise to an inter-modulation spectrum when two CW signals are applied to the input.
FIG. 1b illustrates the basic idea of canceling the inter-modulation present in a non-linear MCPA in accordance to the state of the art.
Figure 2:
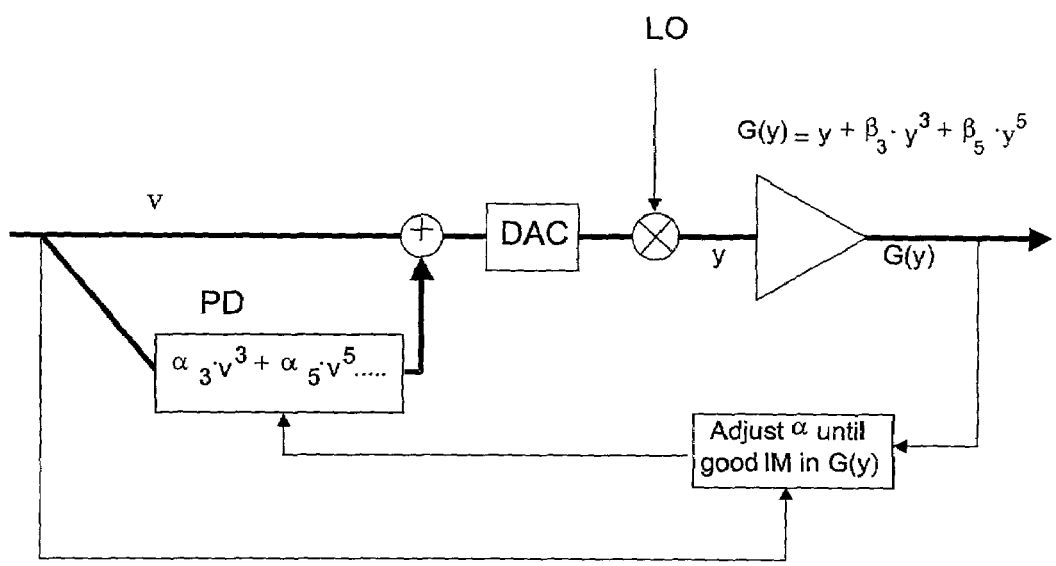
FIG. 2 illustrates a state of the art pre-distortion schematics with a real-time pre-distorter inserted between the channelizer unit and the DAC and a feedback of the output spectrum to adjust for minimum inter-modulation.

At present, the common suggestion of implementing digital pre-distortion is to place a digital correction throughput at IF frequency just before the digital-to-analog converter (DAC) (see FIG. 2). The procedure is to continuously feedback the PA output to make corrections accordingly to the PD in order to minimize the output IM. This is usually made in a real-time fashion where the various higher order components at the PA output are cross-correlated in real-time with calculated input equivalents to give estimations of the PD parameters.

$$MCPA(x) = x + \beta_3 \cdot x^3 \cdot \beta_5 \cdot x^5 \quad (1)$$

To further exemplify, let us assume that the PA characteristics can be modeled as the expression in Equation (1), which is often used for multi-carrier power amplifiers (MCPA). This expression does not take into account possible AM-to-PM dependencies, but nevertheless serves the purpose of describing the characteristics for a first evaluation. That is, in the example only AM-to-AM is considered but the procedure may easily be extended to hold for any type of model. It is also possible to add even components to Equation (1) but those frequency components will end up at base-band or at twice the frequency band of interest. It should further be noted that $\beta_n \ll 1$.

$$PD(v) = v - \alpha_3 \cdot v^3 - \alpha_5 \cdot v^5 \quad (2)$$

Now, the initiated guess for a good PD would be to "bend" the MCPA characteristics the "other way". That is, using the same expression as the MCPA but with opposite signs on the parameters would probably yield a good result. Therefore, the expression in Equation (2) is often used for the PD. Again it is assumed that $\alpha_n \ll 1$ $$MCPA(PD(v)) = PD(v) + \beta_3 \cdot PD(v)^3 + \beta_5 PD(v)^5 \quad (3)$$

$$MCPA(v) = v - \alpha_3 \cdot v^3 - \alpha_5 \cdot v^5 + \beta_3 (v - \alpha_3 \cdot v^3 - \alpha_5 \cdot v^5)^3 + + \beta_5 \cdot (v - \alpha_3 \cdot v^3 - \alpha_5 \cdot v^5)^5 \quad (4)$$

If we insert this expression into Equation (1) we arrive at an expression for the signal spectrum at the output of the MCPA including the PD as in Equation (3). This may be further expanded to give Equation (4).

And finally from Equation (4) we can collect the 1: st, 3: rd, 5: th and the 7: nth order parts which makes it more obvious to what extent we get inter-modulation at the MCPA output.

$$MCPA(v) = v + (-\alpha_3 + \beta_3) \cdot v^3 + (-\alpha_5 - 3 \cdot \beta_3 \cdot \alpha_3 + \beta_5) \cdot v^5 + + [\beta_3 \cdot (-3 \cdot \alpha_5 + 3 \cdot \alpha_3^2) - 5 \cdot \beta_5 \cdot \alpha_3] \cdot v^7 \quad (5)$$

It is clear from Equation (5) above that parameters that minimize the total 3: rd and 5: th IM output should be chosen such that $\alpha_3 = \beta_3$ (see $v^3$-term) and $\alpha_5 = \beta_5$ (see $v^5$-term). That is, the PD correction curve is somewhat a mirror function of the PA characteristics itself.

Multi carrier power amplifiers are difficult to design for sufficiently low inter-modulation products. Pre-distortion techniques may therefore be interesting improvement techniques. The drawback of today's solution is that time delays in the system has to be taken care of between input signals and output signals. Also processing time to compute real-time changes to parameters is difficult to keep down. The calculations would require high processing capability to cope with real-time compensations. PD is usually also implemented as a real-time pre-distorter which makes it even more difficult to implement. Also, analog RF pre-distorters tend to become very complicated and there is a large risk that phase and amplitude errors may occur in the system. It is essential that the cost of design and production of linear MCPA's should be kept low. It is also desirable to increase the power efficiency from 6% as of today to a higher figure. Pre-distortion is still the most likely to be the solution to this problem.

It is therefore proposed, in order to overcome the above problems in the calibration and calculation of pre-distorter, that the parameters should be implemented completely off-line. That is, the first step would be to just measure the output spectrum of the MCPA when applying a known input signal spectrum. Then, off-line, the parameters of the MCPA model would be calculated by setting up some minimizing equation and match to one or more frequencies of the spectrum. It is evident that this procedure requires some sort of spectrum analyzing techniques such as for example offered by the FFT algorithm. Having a model for the MCPA and knowing the input spectrum it is obvious that the parameters of the PD that gives the overall best IM performance to the system (PD+MCPA) can be calculated. The last step is to download the parameters to the PD and continue the transmission of channel traffic.

Technical Description

Figure 3:
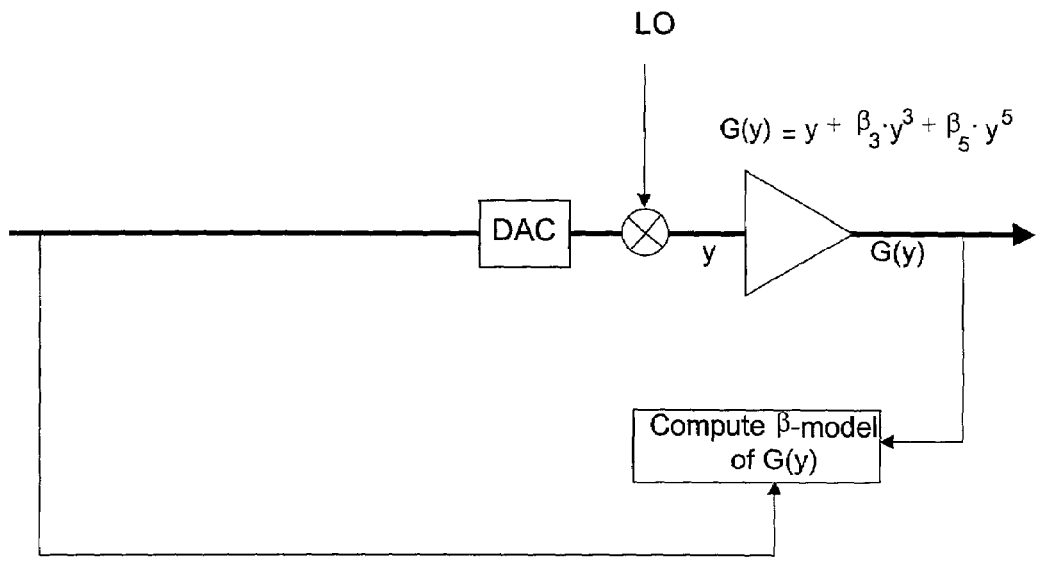
FIG. 3 illustrates a first step of signal acquisition in a calibration of the pre-distorter.

Step 1. The first step is to carefully measure the active power amplifier device by means of inserting a spectrum of known CW carriers giving a distorted spectrum at the output of the amplifier (see FIG. 3). Parameters of the PA model can then be solved by some means of minimization procedure or solving a system of linear equations. The calculations are preferably made in the Fourier frequency domain, thus comparing spectrum points rather than comparing time series.

Figure 4:
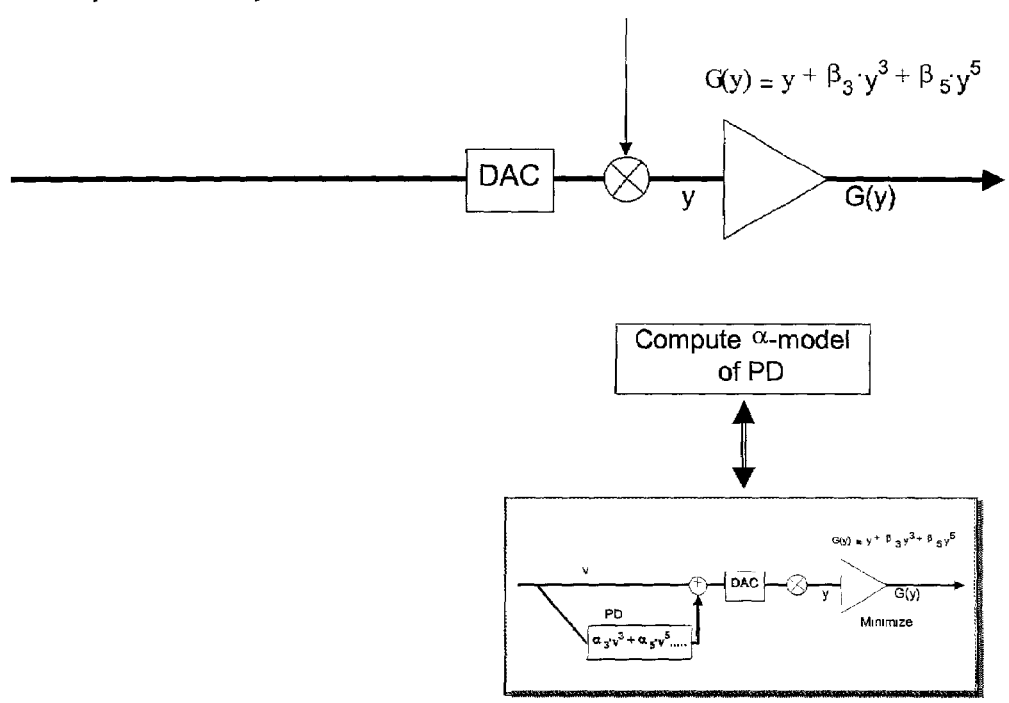
FIG. 4 illustrates off-line computation of both MCPA parameters from data acquired in Step 1 and also the computation of optimum pre-distorter parameters.

Step 2. The second step of the present method is to use the PA model computed in Step 1 but now also insert a pre-distorter at the input port (see FIG. 4). Note that this step is made "off-line" and not in real time. The mathematical model of the PD should (but must not) be of the same type as the model of the PA in order to effectively cancel inter-modulation products in the MCPA. Optimal parameters of the PD can now be computed for the combined system of PD+PA to give minimum inter-modulation at the PA output. Note that initially also the same parameters as computed in Step 1 may directly be used for the PD (with reversed sign). This will give fairly good inter-modulation levels, but can be further optimized as described in Step 2. The same input spectrum should be used in all cases of the off-line procedure used to measure the MCPA in Step 1.

Figure 5:
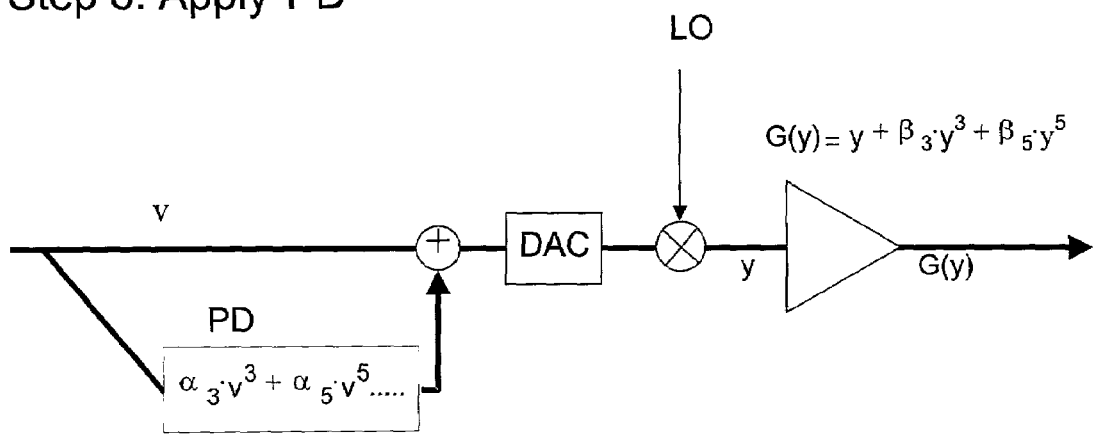
FIG. 5 illustrates insertion of the pre-distorter to distort the input signal to the MCPA.

Step 3. The third step of the present inventive method is to insert the computed parameters from Step 2 into the real hardware PD (FIG. 5). This PD may be of any digital kind (FPGA, DSP, etc.) or even implemented in RF analog form. The parameters for the PD will be effective also if the input spectrum changes, as long as the parameters of the real PA does not change considerably (see example).

After inserting the parameters to the PD it is advised to continuously monitor (at slow rate) the output-spectrum of the PA and make incremental adjustments to the PD parameters as needed. Then a new set of parameters for the PA may be computed by knowledge of the input spectrum, PA parameters and the output spectrum. The procedure of Step 2 may now be repeated "off-line".

EXAMPLE

Figure 6:
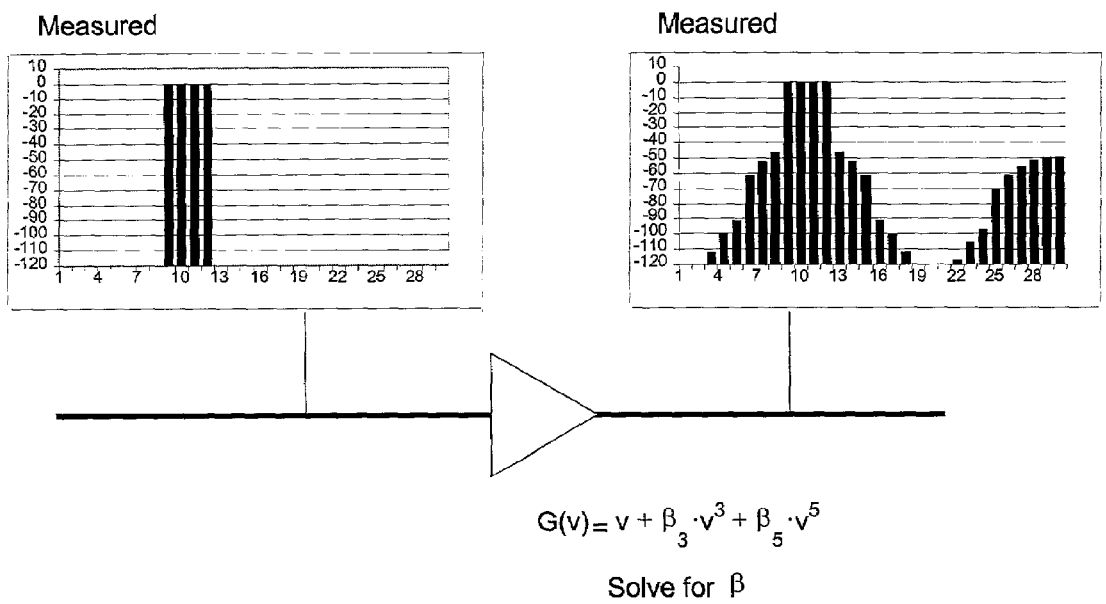
FIG. 6 illustrates calculation of power amplifier parameters by off-line computation and measured data being used to solve a system of equations simultaneously.

As an example, consider an MCPA having about 45 dBc in-band inter-modulation when fed with signals of a certain spectrum mask and power level (See FIG. 6). According to the procedure described above, the first step is to compare input and output spectrum and try to calculate the parameters, which characterizes the MCPA. This may be done by applying a solve procedure that makes the guess-spectrum equal to the measured one. Several standard algorithms, well known by persons skilled in the art, can be applied, therefore no particular one is favored by this description. A single frequency may be picked or alternatively several frequencies at the same time may yield a better result.

The next step is to calculate the optimum pre-distortion parameters to give lowest inter-modulation at the output. The transfer function to be used is the PD in series with the MCPA model. This time a minimization procedure should be used. Again at choice, one or alternatively several frequencies (IM) may be chosen to calculate the best PD parameters.

Figure 7:
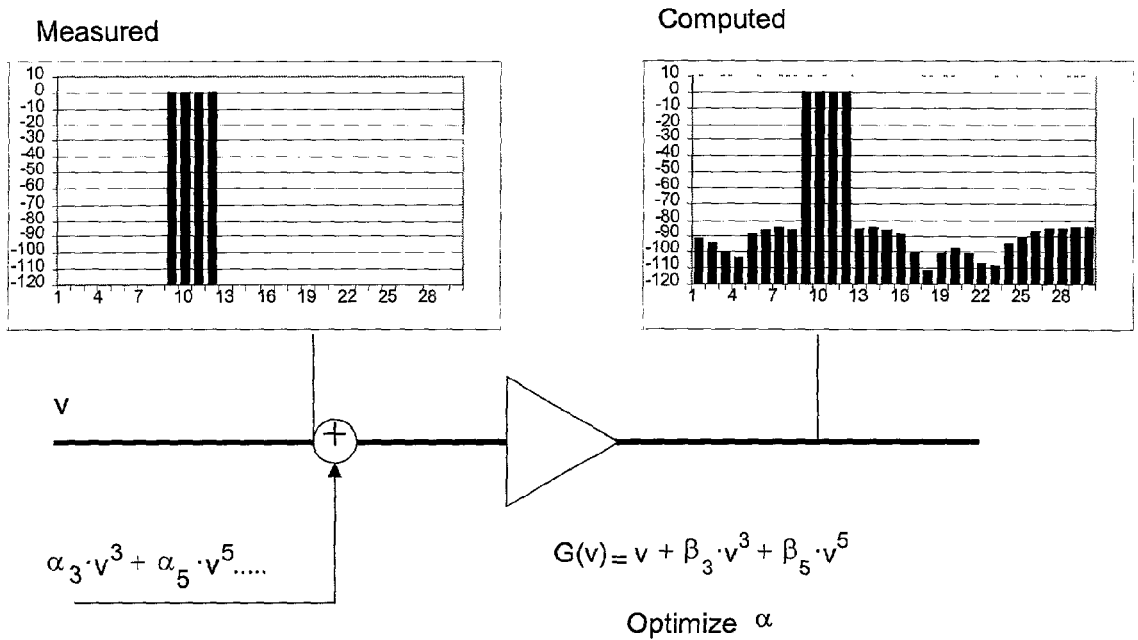
FIG. 7 illustrates optimization of pre-distorter parameters by off-line computation to give minimum level of inter-modulation products.
Figure 8:
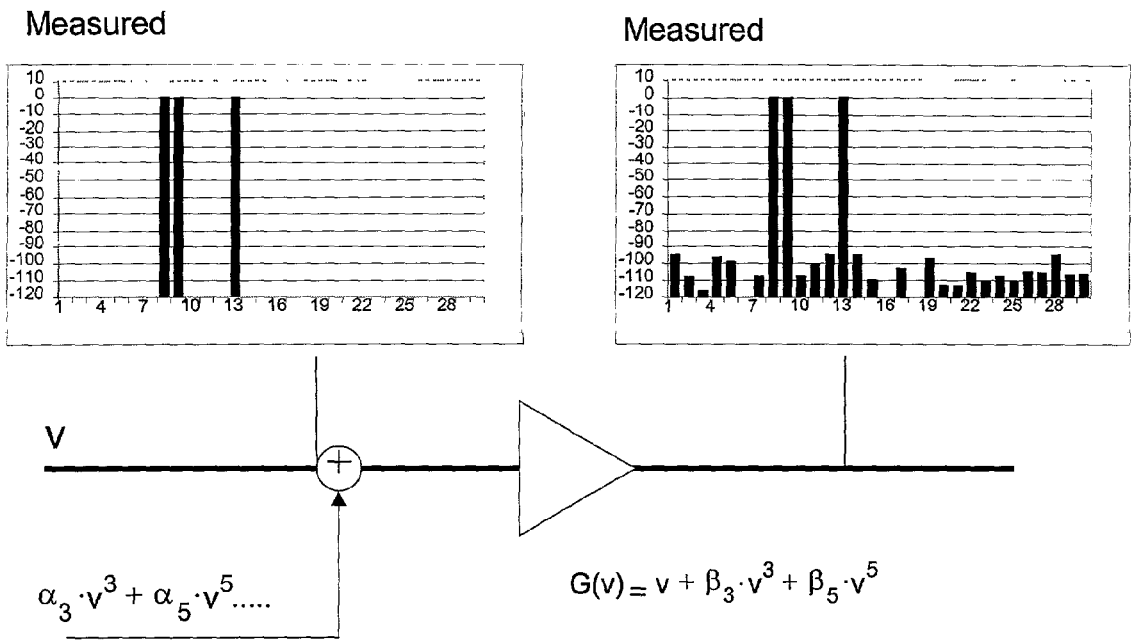
FIG. 8 illustrates insertion of parameters into the pre-distorter.
Figure 9:
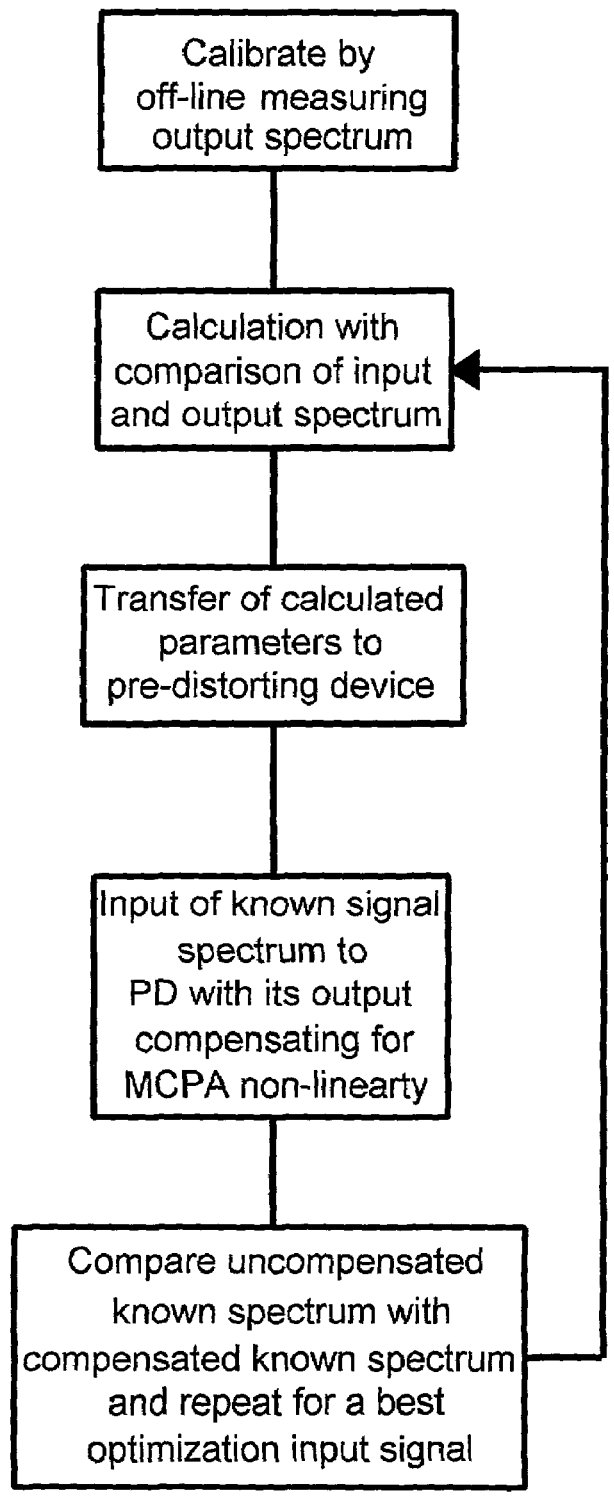
FIG. 9 is a simplified flow chart illustrating the present method of off-line decision of parameters for minimization of inter-modulation in a power amplifier.

Finally, using these PD parameters for the pre-distorter will give considerably lower inter-modulation as demonstrated in FIG. 7. Actually, in this theoretical example, the IM-performance is down to −80 dBc or below. Testing again with a different set of input signals to the same PD and MCPA without re-computing any parameters will still give satisfactory inter-modulation characteristics (also see FIG. 8). Still the IM-performance in this example is well below −90 dBc.

It should be noted that the actual figures as obtained in the example should not be taken as performance values of this method, but rather to exemplify the working procedure.

The benefit of the present innovative method is that a characterization of the MCPA can be calculated off-line and that the pre-distorter parameters also can be calculated off-line. Secondly, possible delays between input and output does not need to be specifically accounted for. Thirdly the pre-distorter itself can be corrected for under ongoing operating conditions for the MCPA. Demodulation of the output signal to the input signal is not even necessary. Calculations can be made directly in the frequency domain by for instance a Fast Fourier Transform (FFT) to minimize a certain part of the IM spectrum. The rest of the spectrum will follow down even if not directly minimized. This procedure can then be used to pre-distort a medium-performance PA having no feed-forward compensation network itself. That is, a considerable cost reduction may be gained by digital pre-distortion using low-cost PA's instead of more expensive MCPA:s.

We claim:

1. A method in a power amplifier for obtaining low inter-modulation characteristics comprising the steps of
    calculating parameters of the power amplifier by inserting a spectrum of known continuous wave (CW) carriers and comparing input and resulting output spectrum when the power amplifier is offline;
    combining the calculated parameters with the output signal of a pre-distorter at the input of the power amplifier, also offline;
    calculating optimal pre-distorter parameters resulting from combining the power amplifier parameters and the output signal of the pre-distorter; and
    inserting, online and in real-time, the calculated optimal pre-distortion parameters into the pre-distorter.

2. The method according to claim 1, comprising the further steps of
    digitizing input and output signals, and
    utilizing for the spectrum analysis a fast Fourier algorithm (FFT) to obtain spectrum points for a comparison in frequency domain of input and output spectra.

3. The method according to claim 1, comprising the further step of utilizing as a known input signal spectrum a multi-carrier signal for performing calibration of a power amplifier operating as a multi-carrier power amplifier (MCPA).

* * * * *